United States Patent [19]

Pinkhasov

[11] Patent Number: 4,975,230
[45] Date of Patent: Dec. 4, 1990

[54] METHOD OF MAKING AN OPEN PORE STRUCTURE

[75] Inventor: Eduard Pinkhasov, Eastchester, N.Y.

[73] Assignee: Vapor Technologies Inc., Mt. Vernon, N.Y.

[21] Appl. No.: 208,886

[22] Filed: Jun. 17, 1988

[51] Int. Cl.$^5$ ............................................. C04B 33/32
[52] U.S. Cl. ........................................ 264/59; 264/81; 427/37
[58] Field of Search ............... 264/59, 81; 427/37, 427/227; 164/46; 428/613; 204/192.38; 429/94

[56] References Cited

U.S. PATENT DOCUMENTS

| | | | |
|---|---|---|---|
| 3,897,221 | 7/1975 | Salyer et al. | 428/613 X |
| 4,076,888 | 2/1978 | Perugini et al. | 428/613 |
| 4,251,603 | 2/1981 | Matsumoto et al. | 428/613 X |
| 4,620,913 | 11/1986 | Bergman | 427/37 |

Primary Examiner—James Lowe
Assistant Examiner—Christopher A. Fiorilla
Attorney, Agent, or Firm—Herbert Dubno

[57] ABSTRACT

An openwork nickel structure having a high surface area to volume ratio and a porosity which is largely independent of the degree to which the metal structure may be compressed, is formed by depositing on a pyrolyzable support, preferably a reticulated open-pore polyurethane support, a coating of metal by arc-striking utilizing at least one electrode of that metal and by bringing the electrodes out of contact with one another. The metal-covered support is then subjected to pyrolysis to form the metal skeleton which is then sintered. The resulting metal structure has been found to be suitable for use as an electrode in a Ni-Cd cell.

11 Claims, 2 Drawing Sheets

4,975,230

METHOD OF MAKING AN OPEN PORE STRUCTURE

CROSS REFERENCE TO RELATED APPLICATION

This application is related to my copending application Ser. No. 06/941,185 filed Dec. 12, 1986 and also relates to subject matter disclosed in prior applications linked to this copending application and which have matured into U.S. Pat. Nos.:

| | | |
|---|---|---|
| 4,351,855 | 4,438,153, | 4,505,948, |
| 4,537,794 | 4,548,670, | 4,565,711, |
| 4,569,307, and | 4,575,401. | |

FIELD OF THE INVENTION

My present invention relates to an openwork structure having a high surface area/volume ratio, to macro and microporous structures and to openwork structures generally which are characterized by a high degree of microscopic irregularity on the walls of the structure bounding the interstices, cells or pores of the structure. Such structures, while preferably of metal (e.g. elemental metals and alloys) can also be composed of semiconductors or ceramics.

The invention also relates to battery electrodes formed from such structures, other products constituted of or utilizing such structures and an improved method of making the structure.

Typical products in and for which the openwork structures may be used are anodes of Ni-Cd batteries, alkaline batteries and fuel cells using the high specific surface area and high porosity, electrodes for electrolysis, carriers for catalysts and catalysts for industrial, motor vehicle and home use and as or in gas sensors, atomizers and gasifiers for heating equipment using the capillarity and flow dispersion properties of the structures, as liquid, droplet and mist separators in gas-liquid separation, as filters, as acoustic dampers and as seals.

BACKGROUND OF THE INVENTION

Reticulate metal structures have been generated heretofore for many purposes. For example, such structures may provide a conductive network suitable for use as supports in batteries in which an active material is applied to and held in place by the supports or is formed on the support.

Depending upon the porosity of the structures, they may be used as sieves, screens or the like.

Porous and reticulate metal structures and structures of other materials such as alloys, semiconductors or ceramics, moreover, may be used as active materials as battery electrodes, or as catalytic materials or catalyst supports because of the relatively high surface area to volume ratio which the reticulate structures manifest.

In the past, the structures have been formed by chemical vapor deposition, electroless deposition and even electroplating techniques on a fibrous support, e.g. a nonwoven fabric or needled fabric of synthetic resin fibers, which can be pyrolyzed to eliminate the fiber and leave a reticulate metal structure.

When electroplating techniques are used, it is necessary to pretreat the support so as to make it sufficiently conductive to allow the electroplating process to operate Whether the metal material is applied to the support by electroplating or other prior art deposition techniques which have been used for this purpose, the deposit which is formed tends to be highly regular, i.e. with a minimum of sharp-edged angled surfaces on a microscopic level. Thus, while the prior art reticulate metal structures have a comparatively large surface area to volume ratio, that ratio is nevertheless limited by the method which has been used in the production of the product.

I have now discovered that, when low temperature arc vapor deposition is used to deposit a material adapted to form a porous structure on an openwork support, the product so made is subjected to pyrolysis, and the structure which remains after pyrolysis is sintered into a coherent body, the resulting product is characterized inter alia by a surprisingly larger surface area to volume ratio than can be obtained by electrodeposition techniques and other systems heretofore used in the formation of such reticulate structures.

The techniques which I have developed as described in the aforementioned application and patents appear to be ideal for this purpose, although it was entirely unexpected that they would be capable of depositing metals and the other porous-structure materials defined within the depths of an essentially porous structure.

OBJECTS OF THE INVENTION

It is the principal object of the present invention to provide an improved method of making a reticulate product having a high surface area to volume ratio.

Another object of this invention is to provide an improved method of making a battery electrode and especially a nickel battery electrode which has greater activity as well as excellent mechanical strength by comparison with prior art electrode structures.

Still another object of this invention is to provide a method of making a reticulate structure, particularly a metal structure, which allows for fine control of the properties of that structure.

It is also an object of this invention to provide an improved reticulate or openwork structure, particularly a metal structure, which may be used for a variety of purposes and which can be made highly economically, reproducibly and reliably.

SUMMARY OF THE INVENTION

These objects and others which will become apparent hereinafter are attained, in accordance with this invention, in a method of making a reticulate structure which comprises the steps of applying to an openwork pyrolyzable substrate and preferably a pyrolyzable foam of a synthetic resin material, by low-temperature arc vapor deposition, a coating of at least one material selected from the group which consists of metals, semiconductors and ceramics to form a coated product which retains its openwork structure. In a best mode embodiment, the material is a metal, e.g. an elemental metal or an alloy.

The coated product is then subjected to pyrolysis to thermally destroy the synthetic resin support and form a reticulate structure of the material selected from the group which consists of metals, semiconductors and ceramics which is then subjected to sintering to provide a mechanically stable and coherent highly branched structure with irregular surfaces. In some cases we may elect to omit the pyrolysis step.

According to a feature of the invention, the substrate, which preferably is an openwork foam plastic support capable of low-temperature thermal decomposition, which may have been pretreated to promote adhesion of the material to be applied, e.g. in a surface activation field such as an electron-beam field or by exposure to a solvent vapor, is coated with the material throughout the thickness of the support by juxtaposing the support with a pair of electrodes between which a low voltage, high-current arc is formed by drawing one of the electrodes into and out of contact with the other while an electric power source, e.g. a direct-current source, is connected across the electrodes. Surprisingly the support material, while highly sensitive to heat, is not destroyed or fused by this deposition method.

The coating step is carried out in an evacuated space, preferably a space maintained at a vacuum which preferably is at a pressure no higher than $10^{-3}$ torr and normally will be between $10^{31\ 3}$ and $10^{-5}$ torr. The space can contain an inert gas or reactive gas environment, the latter being the case when compounds such as semiconductors or ceramics are to be deposited. The electric source can apply a voltage from 20 to 150 volts across the electrodes and the source should be capable of delivering from 40 to 150 amperes.

One of the electrodes, at least, should be composed of at least an element of the material to be deposited, e.g. nickel and, advantageously, both electrodes may be composed of nickel, which is progressively evaporated to transform the metal into the vapor state by the arc discharge and permit the vapor to deposit metal upon the substrate This technique has been found to be highly useful for most temperature-sensitive synthetic resins since there is no appreciable temperature rise at the substrate resulting from the metal deposition.

The foam which is preferentially used as a substrate should be a material which can be thermally decomposed with relative ease. I have found that a reticulated flexible ester-type polyurethane foam provides effective results. The pore size of such foams can be controlled over a wide range of say 10 to 100 pores per linear inch. The product can have a density which is not related to pore size and is about 1.75 pounds per cubic foot over this range.

The thickness of the foam to be coated will largely depend upon the thickness of the product to be made and it is indeed surprising that the coating method of the invention can permit uniform deposits of material to considerable thicknesses of the substrate in a wholly unexpected manner. For example, thicknesses of the foam ranging from 1 mm to 30 mm and more may be coated.

Preferably the foam is of the type described in U.S. Pat. No. 4,670,477 and is made by the method described in that patent or in U.S. Pat. No. 4,656,196.

polyvinylchloride reticulated foams in which the polyurethane foam as described above is coated with polyvinylchloride, in such manner as to preserve the open-pore foam structure may also be used. I can also employ permanently compressed reticulated foam which can be the polyurethane foams described above which have been prestressed to increased densities.

According to a feature of the invention, the open cell reticulate structure, following sintering can be compressed to a desired thickness less than the original thickness of the metal structure and the substrate foam. The compression step allows thin sheets of the structure to be formed so that the overall density is increased. I believe that the porosity of the compressed structure is not materially reduced from the porosity of the structure prior to compression as best as I can determine, for example, from gas flow through the structures. The compression allows thin catalyst sheets, for example, to be fabricated from appropriate materials.

The method has been found to be particularly suitable for the fabrication of nickel electrode structures, particularly for use in nickel-cadmium and alkaline cells. However, it may be advantageous to provide structures of other metals than nickel or structures which combine nickel with other metal in various proportions. I have found that it is possible to select the composition of the metal which is deposited with relative ease in a variety of ways. One approach is to provide a sacrificial electrode of the composition to be deposited. Another approach is to juxtapose two electrodes of different metals and to reverse polarity of the direct current source applied to the two electrodes as the arc is being struck so as to selectively evaporate material from both electrodes alternately and over respective periods sufficient to cause the deposit to be made up of corresponding proportions of the two metals.

If, for example, the predominant metal of the coating is to be nickel, than I may provide in addition to the pair of arc-striking electrodes previously described, of which the sacrificial electrode is nickel, one or more additional electrodes of other metals with which I may strike arcs with the same counter-electrode or with other counter-electrodes to contribute corresponding amounts of other metals to the vapor phase from which the coating is deposited upon the substrate.

With respect to the pyrolysis step, I have found that the pyrolysis can be effected best in an electric furnace in the presence of air, which can be supplied to the electric furnace at a rate sufficient to allow combustion and thermal degradation of the polyurethane foam so that there is no residue or the residue is insignificant.

For relatively thin coated substrates, e.g. of a thickness of the order of several mm, a temperature of about 350° C. and a residence time of 2 minutes may suffice in the pyrolysis furnace. With thicker coated substrates, longer periods and somewhat higher temperatures may be necessary.

The sintering is advantageously carried out with exclusion of oxygen, e.g. in a vacuum furnace in an inert gas or reducing gas atmosphere, at a temperature below the melting point of the metal used and at a temperature at which the metal will sinter without applied pressure and in which reducing conditions may apply.

For example, in the case of nickel, a temperature of 750° C. to 1250° C. for a period of the order of 15 minutes may be used. The products obtained can be used directly, as noted, e.g. as battery electrodes for Ni-Cd, alkaline and other cells.

If desired, coatings of other materials may be applied to the metal, prior to pyrolysis and sintering or subsequently thereto utilizing the low-temperature arc vapor deposition principles of my above-identified copending application or patents.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
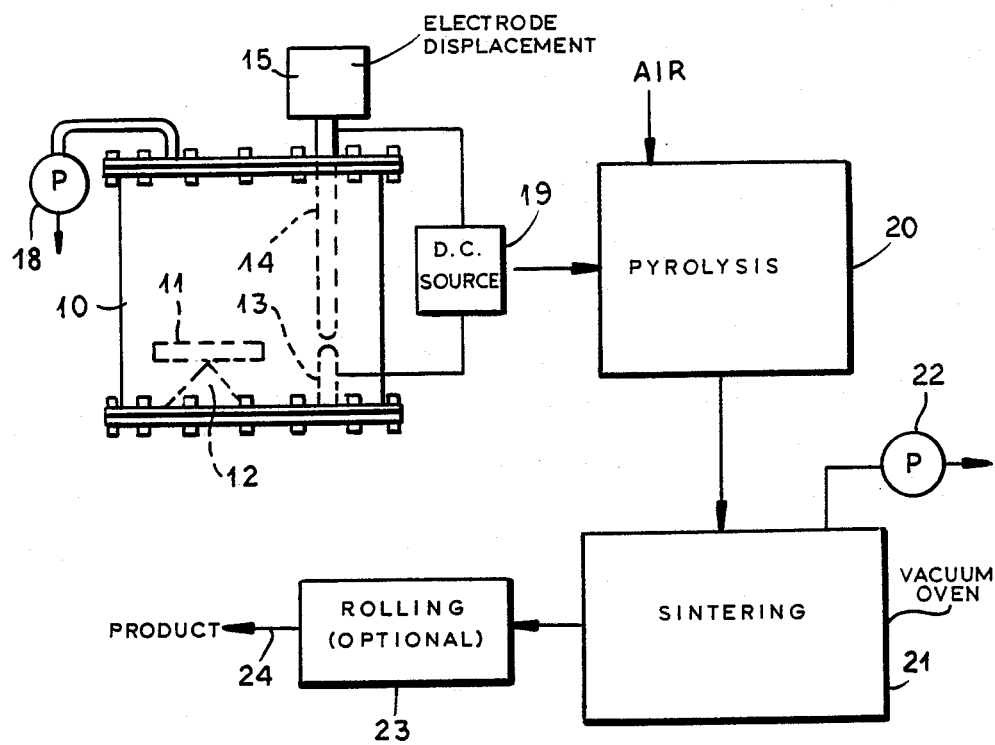
FIG. 1 is a diagram partially in block form and partially in elevation of an apparatus for carrying out the process of the present invention.

In FIG. 1 of the drawing, I have shown an apparatus for practicing the method of the present invention, the apparatus comprising a vacuum chamber 10 in which a substrate 11, e.g. the reticulate open-pore flexible polyurethane foam which has been described previously is made, for example, by the methods of U.S. Pat. Nos. 4,670,477 or 4,656,196. The substrate 11 is mounted on a support diagrammatically shown at 12.

Juxtaposed with this substrate in the vacuum chamber 10 are a pair of electrodes, namely, an electrode 13 which is stationary and an electrode 14 which can be composed of the metal to be deposited on the foam, e.g. nickel.

The nickel electrode 14 can be brought out of contact with the electrode 13 by an electrode feeder 15 to strike the arc.

The chamber can be evacuated by a high-vacuum pump 18 to a pressure of $10^{-3}$ to $10^{-5}$ torr during the coating operation.

Across the electrodes is connected a D.C. source 19 capable of delivering 20 to 150 volts and supplying 40 to 150 amperes.

In operation, an arc is struck across the electrodes which preferentially evaporates nickel from the electrode 14, the nickel depositing on the polyurethane foam 11 in a coarse structure which completely coats the surfaces of the polyurethane foam within the open-pore structure and through the thickness thereof.

The nickel-coated polyurethane foam is subjected to pyrolysis in the presence of air in electric furnace 20 for a period of time sufficient to completely destroy the polyurethane skeleton and leave a nickel openwork.

The nickel openwork is then subjected to a vacuum in a furnace 21 provided with a vacuum pump 22 or containing argon as an inert gas with or without hydrogen as a reducing gas and is sintered for a period of time sufficient to render the nickel openwork structure coherent and mechanically stable. If desired, the thickness of the nickel structure thus obtained can be adjusted by rolling or pressing in a subsequent stage 23 to yield the product at 24.

The nickel structure as thus fabricated has been found to be highly satisfactory as an electrode material for Ni-Cd and alkaline cells, a metal structure serving as a conductive support and to which other electrode materials may be applied, as a catalyst or catalyst support, and as a filter material.

Figure 2:
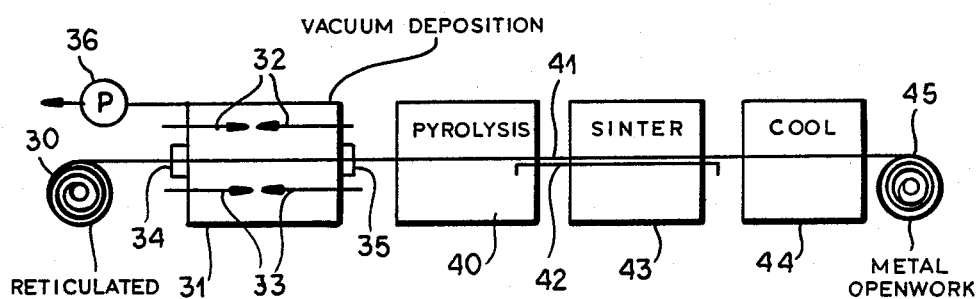
FIG. 2 is a diagram of another apparatus for carrying out the method of the invention.

FIG. 2 shows a system for fabricating a continuous metal web of the improved material of the invention.

In FIG. 2, I show a roll 3 of the reticulated open-pore polyurethane foam being fed to a vacuum deposition stage 31 in which arc-striking electrodes 32 and 33 of nickel are disposed above and below the web and are capable of generating large-area coating of the web as described in my aforementioned copending application and my earlier patents.

Vacuum locks 34 and 35 may assist in preserving the vacuum within the chamber 31 as generated by the high-vacuum pump 36. After through coating with the metal, e.g. nickel, the foam web passes into the pyrolysis furnace 40 which may be an electric furnace operating in an air-containing atmosphere in which the pyrolysis is carried out to completely destroy the polyurethane support. The resulting metal web 41 has an open-pore structure and may be supported, if desired, on a ceramic support 42.

The web 41 then continues into the vacuum oven 43 for sintering. Instead of a vacuum oven, I may employ an electric furnace operated with a protective atmosphere, the protective atmosphere being an inert gas or a reducing gas, for sintering.

From the furnace 43, the web passes through a cooling stage at 44 before being wound in a roll 45. Of course, an intermediate compression stage may be provided between the coiler 45 and the cooling stage 44 to reduce the thickness of the openwork metal web if desired.

Figure 3:
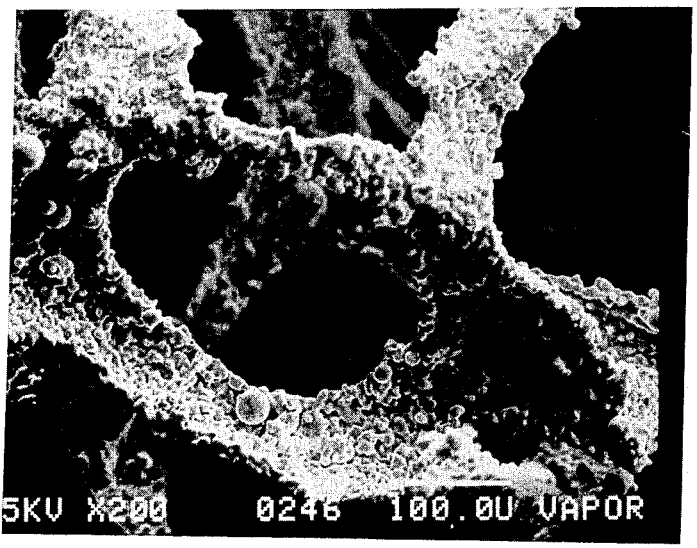
FIGS. 3 and 4 are, respectively, scanning electron micrographs illustrating structures fabricated in accordance with the invention and by electrodeposition, the first utilizing principles of the present invention and the second representing a product which is currently commercially available for comparison purposes.
Figure 4:
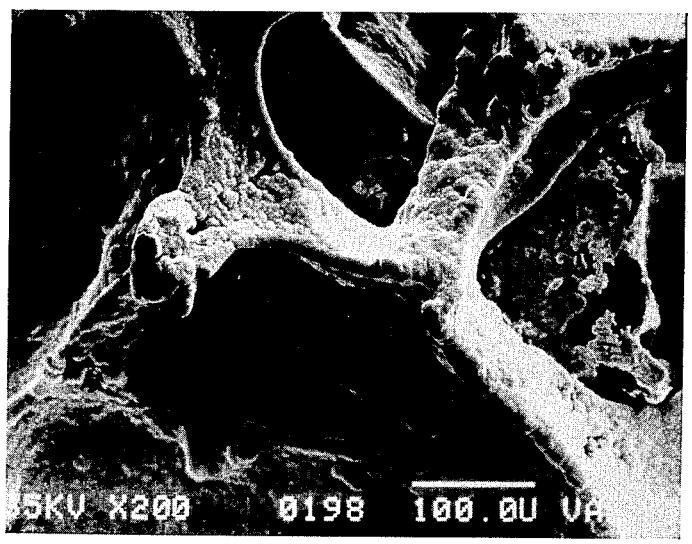

In FIGS. 3 and 4, I have shown, respectively, a nickel openwork foam structure made in accordance with the principles of this invention and a openwork foam structure commercially available and fabricated, it is believed, by an electrodeposition process. While the latter foam has few knobs or protuberances from the basic nickel skeleton and is generally rounded and comparatively smooth, by contrast, the protuberances and projections on the nickel structure of the openwork made by the method of the invention (FIG. 3) are more numerous, somewhat angled and coarse, thereby leading to a significant increase in the surface area to volume ratio of that nickel structure. Both photographs are scanning electron micrographs made at 35 kV with enlargement of 200× under similar conditions.

SPECIFIC EXAMPLE

A nickel openwork structure for use as an electrode material in nickel-cadmium cells is made by subjecting a 80-pores-per-inch open-pore flexible reticulated ester-type polyurethane foam of a density of about 1.75 pounds per cubic foot and a thickness of approximately 1/16 inch to low-temperature arc vapor deposition in a vacuum chamber to which a vacuum of $10^{-5}$ torr has been applied using nickel electrodes. The applied voltage is 40 volts and an arc current of about 75 amperes is drawn. The process is carried out until the substrate is coated to the full thickness thereof.

The metal-coated polyurethane foam, coated with approximately 50 grams of nickel per square foot although from 20 to 70 grams of nickel per square foot has been found to be applicable, is subjected to pyrolysis in the presence of air in an electric furnace at 350° C. for two minutes and until it is clear that there is full decomposition of the polyurethane structure.

The substrate is then subjected to sintering in a vacuum furnace at 950° C. to 1250° C., preferably about 1100° C. for a period of 5 to 60 minutes, preferably around 15 minutes. The nickel structure has up to 95% porosity and the skeletal structure shown in the scanning electron photomicrograph of FIG. 3.

I claim:

1. A method of fabricating an open-pore structure, comprising:

(a) depositing on and in an openwork synthetic-resin pyrolyzable support a coating of at least one material selected from the group which consists of metals, semiconductors and ceramics by juxtaposing said support with a pair of electrodes at least one of which is composed of at least one element of said material, advancing said electrodes into contact to strike an electric arc between said electrodes and evaporate said element from said one of said electrodes and effect deposition of said material on said support, and evacuating a space in which said support is juxtaposed with such electrodes prior to depositing said material on said support; and (b) sintering the deposited material into a coherent body constituting said open-pore structure.

2. A method of fabricating an open-pore structure, comprising:

(a) depositing on and in an openwork reticulated polyurethane foam pyrolyzable support a coating of at least one material selected from the group which consists of metals, semiconductors and ceramics by juxtaposing said support with a pair of electrodes at least one of which is composed of at least one element of said material, advancing said electrodes into contact to strike an electric arc between said electrodes and evaporate said element from said one of said electrodes and effect deposition of said material on said support, and evacuating a space in which said support is juxtaposed with such electrodes prior to depositing said material on said support;

(b) thereafter pyrolyzing said support to form an openwork skeleton consisting essentially of said material deposited on said support in step (a); and (c) sintering said skeleton into a coherent body constituting said open-pore structure.

3. The method defined in claim 2, further comprising the step of compressing said open-pore structure to a reduced thickness while retaining porosity thereof.

4. The method defined in claim 2 wherein step (a) is carried out by applying a vacuum at a pressure no greater than $10^{-3}$ torr to said steps, applying a voltage of 20 to 150 volts across said electrodes and supplying an arc current of 40 to 150 amperes.

5. The method defined in claim 2 wherein said element is a metal capable of forming an electrode for an electrochemical cell.

6. The method defined in claim 5 wherein said metal is nickel.

7. The method defined in claim 2 wherein said pyrolysis is carried out in the presence of air at a temperature of about 350° C. for a period sufficient to substantially completely eliminate said support.

8. The method defined in claim 7 wherein said sintering is carried out in a vacuum oven in the absence of air or in an inert gas or reducing atmosphere at a temperature between substantially 950° C. to 1250° C. for a period sufficient to sinter said body into a structurally self-supporting state.

9. The method defined in claim 2 wherein 20 to 70 grams per square foot of metal is deposited on said support in step (a).

10. The method defined in claim 2 wherein the vacuum deposition, pyrolysis and sintering are carried out continuously on a continuously advancing web of said support to continuously produce a web of said open-pore structure.

11. A method of making a battery electrode which comprises the steps of:

(a) juxtaposing an open-pore reticulated polyurethane foam support having substantially 10 to 100 pores per linear inch with a pair of electrodes in a space evacuated to a pressure of at most $10^{-3}$ torr with at least one of the electrodes being composed of nickel, applying a voltage of substantially 20 to 150 volts across said electrodes with a current of 40 to 150 amperes and striking an arc between said electrodes, to evaporate nickel and deposit evaporated nickel on and in said support to form a nickel-coated support;

(b) pyrolyzing the support following the nickel coating thereof in step (a) in an electric furnace at a temperature of about 350° C. to form an openwork nickel body; and (c) sintering said openwork nickel body at a temperature of 950° C. to 1250° C. into a coherent openwork nickel structure.

* * * * *